United States Patent
Choi et al.

(10) Patent No.: US 10,438,684 B2
(45) Date of Patent: Oct. 8, 2019

(54) MEMORY DEVICE, MEMORY SYSTEM, AND METHOD OF OPERATING THE MEMORY SYSTEM

(71) Applicant: SAMSUNG ELECTRONICS CO., LTD., Suwon-si, Gyeonggi-Do (KR)

(72) Inventors: Seong-Hyeog Choi, Hwaseong-si (KR); Jun-Jin Kong, Yongin-si (KR); Hong-Rak Son, Anyang-si (KR); Pil-Sang Yoon, Hwaseong-si (KR); Chang-Kyu Seol, Osan-si (KR); Ki-Jun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 639 days.

(21) Appl. No.: 14/696,609

(22) Filed: Apr. 27, 2015

(65) Prior Publication Data

US 2016/0041783 A1     Feb. 11, 2016

(30) Foreign Application Priority Data

Aug. 7, 2014 (KR) .......... 10-2014-0101794

(51) Int. Cl.
*G06F 11/10* (2006.01)
*G11C 29/52* (2006.01)
*G11C 29/04* (2006.01)

(52) U.S. Cl.
CPC .......... *G11C 29/52* (2013.01); *G06F 11/1048* (2013.01); *G11C 2029/0411* (2013.01)

(58) Field of Classification Search
CPC .... G06F 11/10; G06F 11/1076; G06F 11/048; H04L 1/0057; H03M 13/116; G11B 20/1833; G11C 29/52; G11C 2029/0411

USPC .......................................................... 714/801
See application file for complete search history.

(56) References Cited

U.S. PATENT DOCUMENTS

| | | | |
|---|---|---|---|
| 5,323,464 A * | 6/1994 | Elander | H04L 9/0625 380/278 |
| 6,333,983 B1 * | 12/2001 | Enichen | H04L 9/088 380/273 |
| 7,353,348 B2 | 4/2008 | Baba | |
| 7,370,192 B2 | 5/2008 | Sumner | |
| 7,392,401 B2 | 6/2008 | Kohara et al. | |
| 8,130,955 B2 | 3/2012 | Trichina et al. | |
| 8,171,378 B2 | 5/2012 | Choi et al. | |
| 8,290,150 B2 * | 10/2012 | Erhart | H04L 9/302 380/44 |
| 8,291,285 B1 * | 10/2012 | Varnica | H03M 13/1137 714/752 |
| 8,312,269 B2 | 11/2012 | Campello De Souza | |

(Continued)

FOREIGN PATENT DOCUMENTS

| | | |
|---|---|---|
| JP | 2007188138 | 7/2007 |
| JP | 2007265400 | 10/2007 |
| KR | 0857760 B2 | 9/2008 |

*Primary Examiner* — Samir W Rizk
*Assistant Examiner* — Enam Ahmed
(74) *Attorney, Agent, or Firm* — Volentine, Whitt & Francos, PLLC

(57) ABSTRACT

A method of operating a memory system, having a non-volatile memory device, includes processing a response to a first request toward the memory device by using an original key, in response to the first request, generating and storing first parity data corresponding to the original key, and deleting the original key.

27 Claims, 14 Drawing Sheets

(56) References Cited

U.S. PATENT DOCUMENTS

| | | | | |
|---|---|---|---|---|
| 8,625,803 B1* | 1/2014 | Radhakrishnan | ... | H04L 63/0428 |
| | | | | 380/279 |
| 8,799,681 B1* | 8/2014 | Linnell | ............... | G06F 21/62 |
| | | | | 380/277 |
| 8,959,420 B1* | 2/2015 | Piszczek | ............... | G06F 12/10 |
| | | | | 714/801 |
| 9,384,144 B1* | 7/2016 | Yeung | ............... | G06F 11/1016 |
| 2002/0007428 A1* | 1/2002 | Chilton | ............... | G06F 3/0619 |
| | | | | 710/52 |
| 2003/0023861 A1* | 1/2003 | Sako | ............... | G11B 20/00086 |
| | | | | 713/189 |
| 2004/0049646 A1* | 3/2004 | Kusakabe | ............... | G06F 21/79 |
| | | | | 711/164 |
| 2008/0301519 A1* | 12/2008 | Kawabata | ............... | G06F 11/1008 |
| | | | | 714/755 |
| 2009/0089247 A1* | 4/2009 | Blevins | ............... | G06Q 10/00 |
| 2011/0311051 A1* | 12/2011 | Resch | ............... | H04L 63/06 |
| | | | | 380/270 |
| 2012/0066571 A1 | 3/2012 | Marinet | | |
| 2012/0066774 A1 | 3/2012 | Kang et al. | | |
| 2012/0134411 A1* | 5/2012 | Nishi | ............... | H04N 19/46 |
| | | | | 375/240.03 |
| 2012/0304281 A1 | 11/2012 | Kang et al. | | |
| 2013/0073870 A1 | 3/2013 | Sauerwald et al. | | |
| 2015/0309874 A1* | 10/2015 | Liang | ............... | H03M 13/3761 |
| | | | | 714/766 |
| 2018/0197387 A1* | 7/2018 | Dawes | ............... | G06F 3/0412 |

* cited by examiner

MEMORY DEVICE, MEMORY SYSTEM, AND METHOD OF OPERATING THE MEMORY SYSTEM

CROSS-REFERENCE TO RELATED APPLICATION

This application claims the benefit of Korean Patent Application No. 10-2014-0101794, filed on Aug. 7, 2014, in the Korean Intellectual Property Office, the disclosure of which is incorporated herein in its entirety by reference.

BACKGROUND

The application relates to a memory device, a memory system, and a method of operating the memory system, and more particularly, to a memory device, a memory system, and a method of operating the memory system, by which a security function may be performed.

Due to development of the Internet and networks, security at a random device has become important. In particular, since personal information and financial transactions are frequently done through the Internet and networks, there is a need to protect access to a memory device that stores various types of information. To guarantee a quality of products, authentication between a memory device and a controller may be required.

SUMMARY

The application discloses a memory device, a memory system, and a method of operating the memory system, by which a security function may be performed.

According to an aspect of the application, there is provided a method of operating a memory system including a non-volatile memory device, the method including processing a response to a first request toward the memory device by using an original key, in response to the first request; generating and storing first parity data corresponding to the original key; and deleting the original key.

The generating and storing of the first parity data may include generating the first parity data by performing Error Check and Correction (ECC) encoding on the original key; and storing the first parity data in a non-volatile cell array of the memory device.

The method may further include generating second parity data by ECC encoding the first parity data and storing the second parity data.

The method may further include receiving a second request that is activated after the first request; extracting key data from at least one security data in response to the second request; and converting the key data into a first key by using the first parity data.

The method may further include processing a response to the second request by using the first key.

The converting of the key data into the first key may include reading the first parity data from a non-volatile cell array of the memory device; and ECC decoding the key data by using the first parity data.

The extracting of the key data includes extracting the key data by dividing one security data by N, wherein N is an integer equal to or greater than 2. The converting of the key data into the first key may include generating combined data by combining the key data and known data; reading the first parity data from a non-volatile cell array of the memory device; and ECC decoding the combined data by using the first parity data.

The ECC decoding of the combined data may include differently setting a reliability value of the first parity data and a reliability value of the known data.

The extracting of the key data may include extracting the key data from K pieces of the security data, wherein K is an integer equal to or greater than 2, and may further include setting values of K and N based on an error correction capability of an ECC engine that performs the ECC decoding.

The method may further include storing the first key in a volatile storage area of the memory system.

The method may further include receiving a third request that is activated after the second request; and generating a response to the third request by using the first key stored in the volatile storage area, in response to the third request.

The method may further include generating second parity data by ECC encoding the first parity data and storing the second parity data. The converting of the key data into the first key may include reading the first parity data and the second parity data; performing ECC on the first parity data by using the second parity data; and ECC decoding the key data by using the first parity data and the second parity data.

The memory device may be a NAND flash memory device.

In an exemplary embodiment of the method, the key data indicates a physical characteristic of the non-volatile memory device.

In an exemplary embodiment of the method, the physical characteristic is a threshold voltage distribution of programmed memory cells of the non-volatile memory device.

According to another aspect of the application, there is provided a method of operating a memory system including a non-volatile memory device, the method including processing a response to a first request toward the memory device by using an original key, in response to the first request; generating and storing first parity data corresponding to the original key; deleting the original key; and reproducing the original key by using the first parity data, in response to a second request that is activated after the first request.

The reproducing of the original key may include extracting key data from at least one security data, the at least one security data indicating physical characteristics of the non-volatile memory device; padding known data into the key data; reading the first parity data and ECC decoding padded data by using an ECC engine that is used when the memory device writes or reads normal data; and processing a response to the second request by using a result of the ECC decoding.

In an exemplary embodiment of the method, the physical characteristic is a threshold voltage distribution of programmed memory cells of the non-volatile memory device.

According to another aspect of the application, there is provided a memory system having a nonvolatile memory and a memory controller. The memory controller retrieves, upon receiving a request for access to the nonvolatile memory, first and second parity data from the nonvolatile memory and performs error correction on the retrieved first parity data using the second parity data. Additionally, the memory controller retrieves key data stored in the nonvolatile memory, reproduces an original key by error-correction decoding the key data using the error-corrected first parity data, and processes a response to the request for access to the nonvolatile memory using the reproduced key.

In an exemplary embodiment, the key data comprises a threshold voltage distribution of one or more programmed memory cells of the non-volatile memory device.

In an exemplary embodiment, the memory controller stores the reproduced key in volatile memory and processes a subsequently-received request for access to the nonvolatile memory using the reproduced key stored in the volatile memory.

In an exemplary embodiment, the memory controller further: retrieves the original key from the nonvolatile memory upon receiving an initial request for access to the nonvolatile memory; error-correction encodes the retrieved original key to generate the first parity data; stores the generated first parity data in the nonvolatile memory; erases the original key from the nonvolatile memory; error-correction encodes the first parity data to generate the second parity data; and stores the generated second parity data in the nonvolatile memory.

In an exemplary embodiment, the memory controller processes a response to the initial request for access to the nonvolatile memory using the original key retrieved from the nonvolatile memory and, thereafter, erases the original key from the nonvolatile memory.

According to another aspect of the application, there is provided a method executed by a memory controller of providing access to a nonvolatile memory. The method includes retrieving, upon receiving a request for access to the nonvolatile memory, first and second parity data and key data stored in the nonvolatile memory; performing error correction on the retrieved first parity data using the second parity data; reproducing an original key by error-correction decoding the key data using the error-corrected first parity data; and processing a response to the request for access to the nonvolatile memory using the reproduced key.

In an exemplary embodiment of the method, the key data comprises a threshold voltage distribution of one or more programmed memory cells of the non-volatile memory device.

In an exemplary embodiment of the method, the memory controller further stores the reproduced key in volatile memory and processes a subsequently-received request for access to the nonvolatile memory using the reproduced key stored in the volatile memory.

In an exemplary embodiment of the method, the memory controller further retrieves the original key from the nonvolatile memory upon receiving an initial request for access to the nonvolatile memory; error-correction encodes the retrieved original key to generate the first parity data; stores the generated first parity data in the nonvolatile memory; erases the original key from the nonvolatile memory; error-correction encodes the first parity data to generate the second parity data; and stores the generated second parity data in the nonvolatile memory.

In an exemplary embodiment of the method, the memory controller further processes a response to the initial request for access to the nonvolatile memory using the original key retrieved from the nonvolatile memory and, thereafter, erases the original key from the nonvolatile memory.

BRIEF DESCRIPTION OF THE DRAWINGS

Exemplary embodiments of the application will be more clearly understood from the following detailed description taken in conjunction with the accompanying drawings in which.

DETAILED DESCRIPTION OF THE EMBODIMENTS

Figure 1:
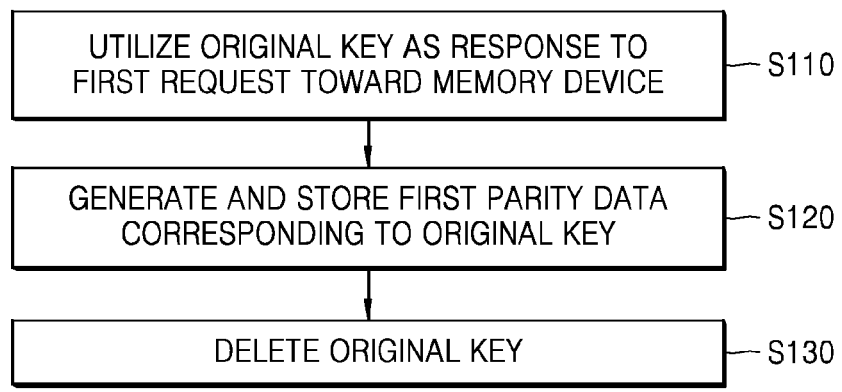
FIG. 1 is a flowchart of a method of operating a memory system, according to an embodiment of the application.

As used herein, the term "and/or" includes any and all combinations of one or more of the associated listed items. Expressions such as "at least one of," when preceding a list of elements, modify the entire list of elements and do not modify the individual elements of the list.

Hereinafter, the technology will be described more fully with reference to the accompanying drawings, in which exemplary embodiments of the application are shown. These embodiments are provided so that this disclosure will be thorough and complete, and will fully convey the scope of the application to one of ordinary skill in the art. As the application allows for various changes and numerous embodiments, particular embodiments will be illustrated in the drawings and described in detail in the written description. However, this is not intended to limit the application to particular modes of practice, and it is to be appreciated that all changes, equivalents, and substitutes that do not depart from the spirit and technical scope of the application are encompassed in the application. In the drawings, like reference numerals denote like elements and the sizes or thicknesses of elements may be exaggerated for clarity of explanation.

The terms used in the present specification are merely used to describe particular embodiments, and are not intended to limit the application. An expression used in the singular encompasses the expression in the plural, unless it has a clearly different meaning in the context. In the present specification, it is to be understood that the terms such as "including", "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined differently, all terms used in the description including technical and scientific terms have the same meaning as generally understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart of a method of operating a memory system according to an embodiment of the application. Referring to FIG. 1, the method includes an operation S110 of utilizing an original key as a response to a first request toward a memory device, an operation S120 of generating and storing first parity data corresponding to the original key, and an operation S130 of deleting the original key.

Figure 2:
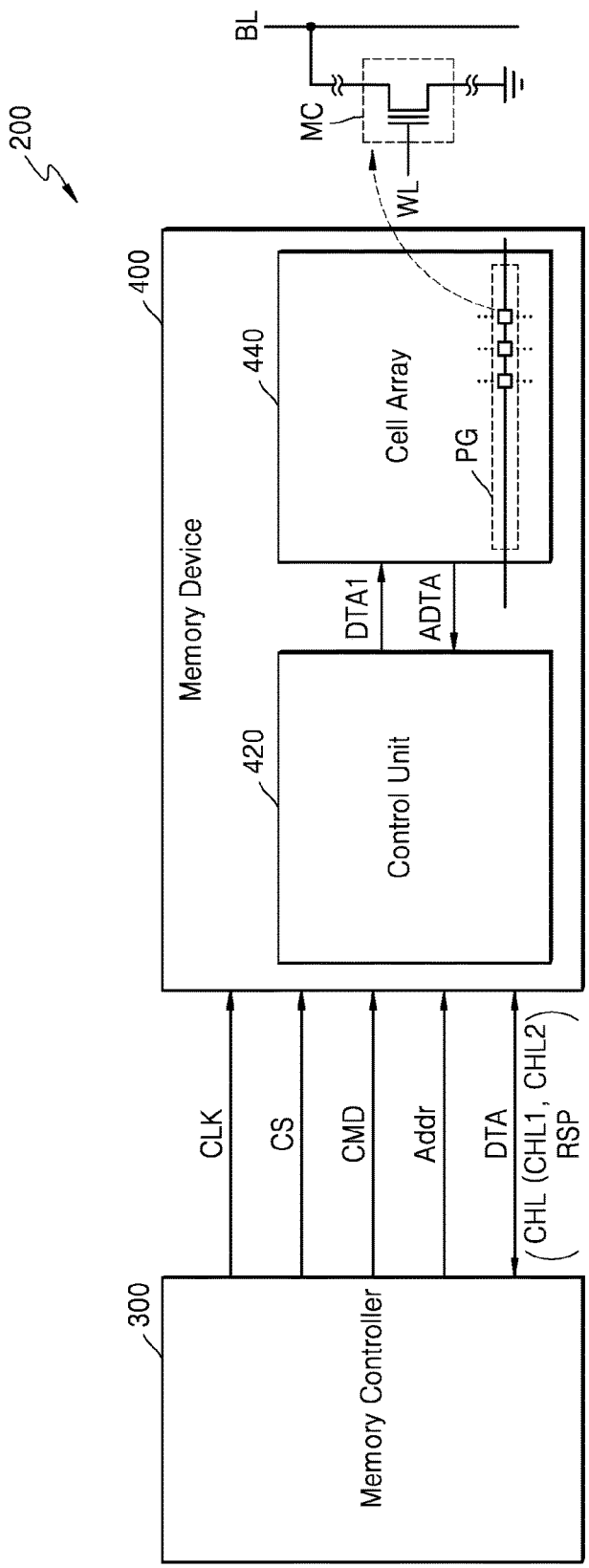
FIG. 2 is a block diagram of a memory system in which the method of FIG. 1 may be performed, according to an embodiment of the application.

FIG. 2 is a block diagram of a memory system 200 in which the method of FIG. 1 may be performed, according to an embodiment of the application. Referring to FIG. 2, the memory system 200 includes a memory controller 300 and a memory device 400. The memory controller 300 provides various signals to the memory device 400 and thus controls a memory operation. For example, the memory controller 300 provides a clock signal CLK, a chip selection signal CS, a command CMD, or an address Addr to the memory device 400, and data DTA for a write operation and a read operation is exchanged between the memory controller 300 and the memory device 400.

The memory device 400 may receive the clock signal CLK, the chip selection signal CS, the command CMD, or the address Addr from the memory controller 300 and may exchange the data DTA with the memory controller 300. The memory device 400 may include a cell array 440 and a control unit 420. The cell array 440 may include a plurality of memory cells MC that may be accessed by wordlines WL and bitlines BL. The memory device 400 of FIG. 2 may be a flash memory device, e.g., a NAND flash memory device. In this case, each of the memory cells MC may include a floating gate transistor, and memory cells connected to the same wordline WL may be called a page PG. Each of the memory cells MC may be a memory unit that may transit between at least two states, each of which corresponds to data. Also, each of the memory cells MC may maintain its state although a power supply to the memory device 400 is discontinued, so that each of the memory cells MC may retain programmed data. Hereinafter, it is assumed that the memory device 400 is a NAND flash memory device but one or more embodiments are not limited thereto.

The control logic 420 may be synchronized with the clock signal CLK received from the memory controller 300 and thus may perform an operation with respect to the cell array 440 according to the command CMD, the address Addr, or the data DTA received from the memory controller 300. In order to perform the operation, although not illustrated in FIG. 2, the memory device 400 may further include a decoder (not shown) that selects a memory cell MC corresponding to the address Addr, a driver (not shown) that applies an operating voltage to a wordline WL so as to perform the operation according to the command CMD on the selected memory cell MC, a voltage generator (not shown) that generates the operating voltage, a data input/output (I/O) unit (not shown) that transmits or receives the data DTA, or the like.

Figure 3:
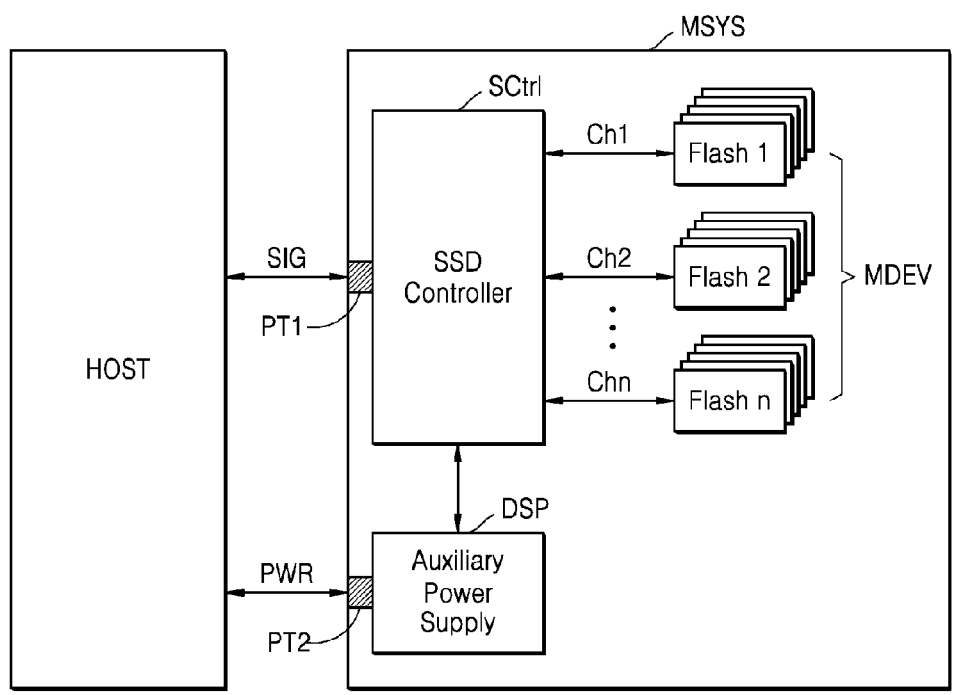
FIG. 3 is a block diagram of an example of the memory system of FIG. 2.

When the memory device 400 of FIG. 2 is a flash memory, e.g., a NAND flash memory device, the memory system 200 may be embodied as a solid state drive (SSD), as shown in FIG. 3 that illustrates an example of the memory system 200 of FIG. 2. Referring to FIG. 3, the SSD MSYS includes an SSD controller SCtrl and one or more flash memory devices MDEV. In response to a signal SIG received from a host device HOST via a first port PT1 of the SSD MSYS, the SSD controller SCtrl controls the flash memory devices MDEV. The SSD controller SCtrl may be connected to the flash memory devices MDEV via a plurality of channels Ch1 through Chn. The SSD MSYS may further include an auxiliary power supply device DSP and thus may receive power PWR from the host device HOST via a second port PT2. However, one or more embodiments are not limited thereto, and the SSD MSYS may receive power from an external device other than the host device HOST. The SSD MSYS may output via the first port PT1 a result SIG that is obtained by processing a request from the host device HOST.

However, due to development of the Internet and networks, a security at a random device has become important. In particular, since personal information and financial transactions are frequently done through the Internet and networks, there is a need to control access to a memory device that stores various types of information. Here, it is required to control direct access to the memory device 400 or indirect access using another memory device 400. For example, an intruder may directly attack the flash memory device Flash1 connected to the channel 1 Ch1 of FIG. 3, or may attack the flash memory device Flash1 via the flash memory device Flash2 connected to the channel 2 Ch2 of FIG. 3. In order to prevent the former case, the memory device 400 may only permit access by the authenticated memory controller 300. In order to prevent the latter case, the memory controller 300 may only perform a control on the authenticated memory device 400. This is because the memory controller 300 may be copied by an unauthenticated memory device.

Thus, in order to prevent copying of the memory controller 300, other than a security of information stored in the memory device 400, the memory controller 300 may perform an authentication operation on the memory device 400. Furthermore, in order to guarantee a quality of the memory system 200, the memory controller 300 may perform the authentication operation on the memory device 400. For example, in the SSD MSYS of FIG. 3, the SSD controller SCtrl may perform the authentication operation on the one or more flash memory devices MDEV so as to verify whether each of the SSD controller SCtrl and the one or more flash memory devices MDEV is manufactured by the same manufacturer or mutually-authenticated manufacturers. However, one or more embodiments are not limited thereto, and the memory device 400 may also perform an authentication operation on the memory controller 300 so as to guarantee the quality of the memory system 200. In other words, according to various requests, it is needed to perform an authentication with respect to a right to access the memory controller 300 and the memory device 400.

Even after this authentication is performed, the memory system 200 may be attacked, and to defend against this attack, the memory controller 300 and the memory device 400 may exchange encrypted data. Here, the memory controller 300 and the memory device 400 may perform encryption by using a key. In this case, there is a need to prevent an intruder from acquiring a threshold voltage distribution related with key generation. This will be described below.

Figure 4:
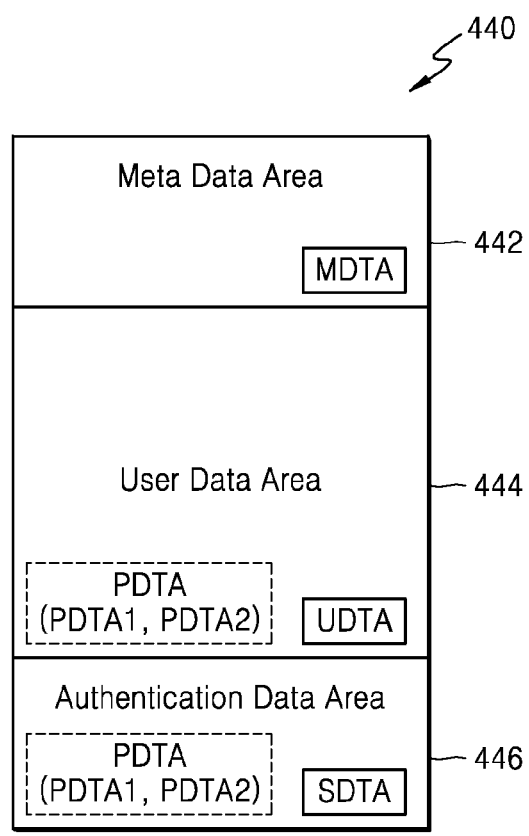
FIG. 4 illustrates an example of a cell array of a memory device included in the memory system of FIG. 2.

FIG. 4 illustrates an example of the cell array 440 of the memory device 400 of FIG. 2. Referring to FIGS. 2 and 4, the cell array 440 may include a metadata area 442, a user data area 444, and a security data area 446. Positions and relative sizes of the metadata area 442, the user data area 444, and the security data area 446 are not limited to those illustrated in FIG. 4. The metadata area 442 may include various types of metadata MDTA for operations of the memory device 400. For example, when the memory device 400 is a flash memory device, an initial read voltage level, a program/erase (P/E) cycle, and mapping information about a log block and a data block may be stored as the metadata MDTA in the metadata area 442.

The user data area 444 may store user data UDTA that is programmed according to a user's request.

Figure 5:
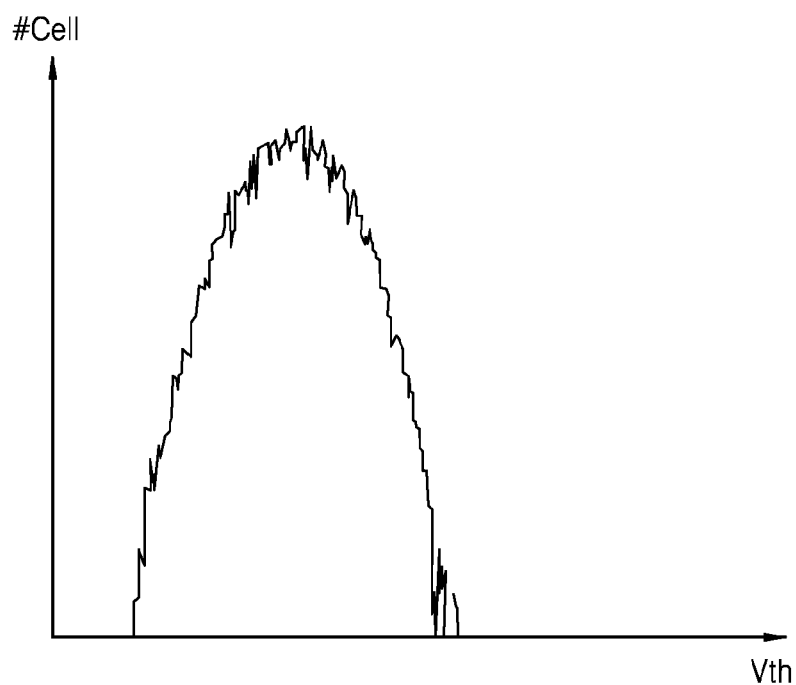
FIG. 5 is a graph illustrating a threshold voltage distribution corresponding to a key explained with reference to FIG. 4.

The security data area 446 stores security data SDTA. The security data SDTA indicates physical characteristics of the memory device 400 and thus may function as a unique identifier of the memory device 400. In other words, like a finger print or a personal identifier of a person, the security data SDTA indicates unique characteristics of the memory device 400 due to physical deviations during a manufacturing process of the memory device 400. For example, even when memory cells of the security data area 446 are programmed by using the same voltage, a threshold voltage distribution of programmed memory cells differs for each memory device. For example, a threshold voltage distribution as shown in FIG. 5 is unique for each memory device. The security data SDTA may be programmed in the security data area 446 during the manufacture of the memory device 400. The security data SDTA may be embodied as the threshold voltage distribution of FIG. 5, and not as a data value. For example, the security data SDTA may be embodied using a voltage other than a program voltage that is used to write the user data UDTA.

Thus, when the memory cells of the security data area 446 are read by using a random read voltage, different types of security data are read from different memory devices. For example, even when the flash memory device Flash1 of the channel 1 Ch1 and the flash memory device Flash2 of the channel 2 Ch2 of FIG. 3 are programmed with the same program voltage, if the flash memory device Flash1 and the flash memory device Flash2 are read for security data, security data read from the flash memory device Flash1 is different from security data read from the flash memory device Flash2.

A size of the security data SDTA may be variously set according to a security level requested by the memory device 400 or the memory system 200, and a level of an allocable resource. For example, the security data SDTA may have a size that is equal to a size of a page or a size obtained by dividing the page by N. Alternatively, the security data SDTA may be set to have a size of a block. When the security data area 446 is set with a size in which one or more pieces of the security data SDTA may be stored, similar to the security data SDTA, the size of the security data area 446 may be variously set according to the security level requested by the memory device 400 or the memory system 200, and the level of the allocable resource.

Alternatively, the cell array 440 may not have a separate area for storing security data, but the security data SDTA may be read from the user data area 444. In other words, an address corresponding to a key readout request which will be described later or an authentication request may indicate the user data area 444.

When the memory system 200 is turned on or the memory device 400 is connected to the memory controller 300, or if required, an authentication operation may be performed between the memory controller 300 and the memory device 400. When the authentication operation is completed, a normal operation (for example, a write or read operation with respect to the user data UDTA) is performed between the memory device 400 and the memory controller 300. At this time, encrypted data may be exchanged using a key in order to achieve security of the memory system 200.

For example, when the memory device 400 is a flash memory device, the normal operation may be a program operation, a read operation, or an erase operation with respect to the flash memory device. Via the program operation, data may be stored in the flash memory device. Here, according to a state available to the memory cell MC of FIG. 2, a size of data to be programmed to the memory cell MC may vary. For example, when the memory cell MC transits between two states, the memory cell MC may store one bit. On the other hand, when the memory cell MC transits between four states, the memory cell MC may store two bits. For example, memory cells MC capable of respectively storing one bit, two bits, three bits, and four bits may be called a single level cell (SLC), a multi level cell (MLC), a triple level cell (TLC), and a quadruple level cell (QLC), respectively.

When the memory cell MC is programmed, electrons may be inserted into a floating gate, and conversely, when the memory cell MC is erased, the electrons that were inserted into the floating gate may be extracted. In order to insert the electrons into the floating gate, a high voltage may be applied to the floating gate. Since gates of the memory cells MC included in one page PG are connected to the same wordline WL, when the memory cell MC is programmed, a high voltage may be uniformly applied to the memory cells MC.

In order to selectively program the memory cells MC included in one page PG, according to program-target data, a voltage to be applied to a bitline BL may be adjusted. The memory cells MC included in one page PG may be connected to different bitlines BL. For example, 0V or 1V may be applied to a bitline BL that is connected to a memory cell MC having a floating gate to which electrons are inserted, whereas a power voltage VDD may be applied to a bitline BL that is connected to a memory cell MC having a floating gate to which insertion of electrons is prevented. The memory cell MC that is connected to the bitline BL to which 0V or 1V is applied may be programmed, and the memory cell MC that is connected to the bitline BL to which the power voltage VDD is applied may be program-inhibited.

The read operation may be similar to the program operation, but voltages that are applied to a bitline BL or a wordline WL, which is connected to a memory cell MC, may be different between the read operation and the program operation. Due to operational characteristics of the flash memory device, a program unit and an erase unit may be different. For example, a data program operation may be performed in units of pages, whereas a data erase operation may be performed in units of blocks, wherein a block is larger than a page.

For example, in order to perform the program operation, the memory controller 300 transmits the command CMD, the address Addr, and the data DTA to the memory device 400. For example, in order to perform the read operation, the memory controller 300 transmits the command CMD and the address Addr to the memory device 400, and the memory device 400 transmits read data DTA to the memory controller 300.

In this case, the security data SDTA may be read out to generate a key. However, one or more embodiments are not limited thereto, and a key may be generated in other manners.

However, when a key is obtained using the threshold voltage distribution of FIG. 5, the threshold voltage distribution may remain and thus may be read by an unauthorized user (intruder). In a memory device, a memory system, and a method of operating the memory system according to an embodiment of the application, an original key (i.e., the key generated using the threshold voltage distribution) may be deleted as illustrated in FIG. 1 to address such an unauthorized readout problem. Moreover, as will be described later, the original key is reproduced and used at a subsequent request. In this case, in the memory device, the memory system, and the method of operating the memory system according to an embodiment of the application, the original key may be efficiently and accurately reproduced. This will now be described in more detail.

Figure 6:
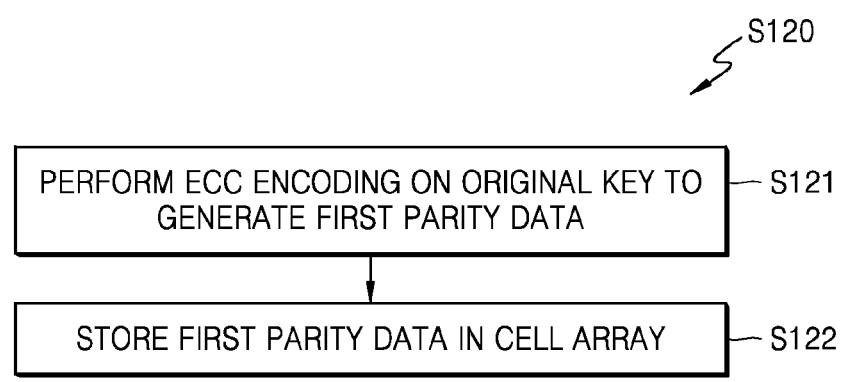
FIG. 6 is a flowchart of an example of an operation of FIG. 1 of generating and storing the first parity data.

FIG. 6 is a flowchart of an example of the operation S120 of FIG. 1 of generating and storing the first parity data corresponding to the original key. Referring to FIGS. 4 and 6, an operation S120 of generating and storing first parity data PDTA1 includes an operation S121 of performing error check and correction (ECC) encoding on the original key to generate the first parity data PDTA1, and an operation S122 of storing the first parity data PDTA1 in the cell array 440. For example, the first parity data PDTA1 may be stored in the security data area 446 of the cell array 440.

However, one or more embodiments are not limited thereto, and the first parity data PDTA1 may be stored in the user data area 444 of the cell array 440. When the user data UDTA, namely, normal data, is stored in the cell array 440, parity data generated by ECC encoding the normal data may be stored together. The first parity data PDTA1 may also be stored in the area where the parity data for the normal data is stored. The first parity data PDTA1 may be stored in the cell array 440 in the same manner as the manner in which the normal data is stored, namely, a program path for the normal data. For example, parity data (i.e., second parity data PDTA2) generated by ECC encoding the first parity data PDTA1 may be stored in the cell array 440, together with the first parity data PDTA1.

Figure 7:
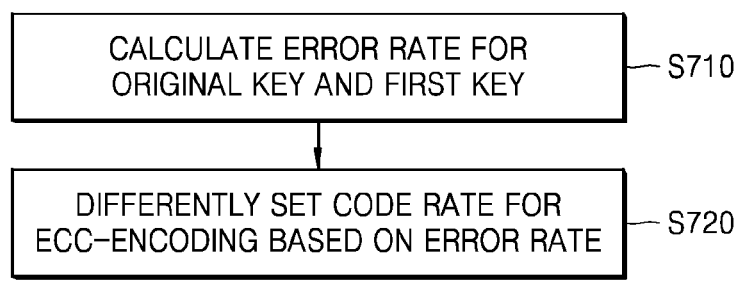
FIG. 7 is a flowchart of an operation of a memory system performed to prevent generation of a difference between an original key deleted in the method of FIG. 1 and an original key (i.e., a first key) obtained by reproducing the original key.

The first parity data PDTA1 for the original key may be generated by an ECC engine provided separately from an ECC engine that performs ECC encoding on the normal data. To overcome a difference between the original key and a first key (i.e., an original key reproduced at a second request which will be described later), for example, a Hamming distance, operation S710 of calculating an error rate for the original key and the first key and operation S720 of differently setting a code rate for ECC encoding based on the error rate may be performed as illustrated in FIG. 7.

In operation S710, the error rate for the original key and the first key may be calculated statistically via a test or a simulation. To this end, the memory controller 300 or the memory device 400 may temporarily retain without deleting the original key during a test or a simulation, or may temporarily store the original key in a storage space other than the memory system. In operation S720, if the Hamming distance is large, the code rate may be set to be low.

The code rate may be represented by k/n when an n-bit code word is encoded into k-bit input data. In other words, when the probability of generation of a difference between the original key and the first key is high due to a large Hamming distance, an encoding degree may be lowered to decrease the probability that errors occur in the first key. The memory controller 300 or the memory device 400 may generate the first parity data PDTA1 by including an ECC engine having the calculated code rate.

Figure 8:
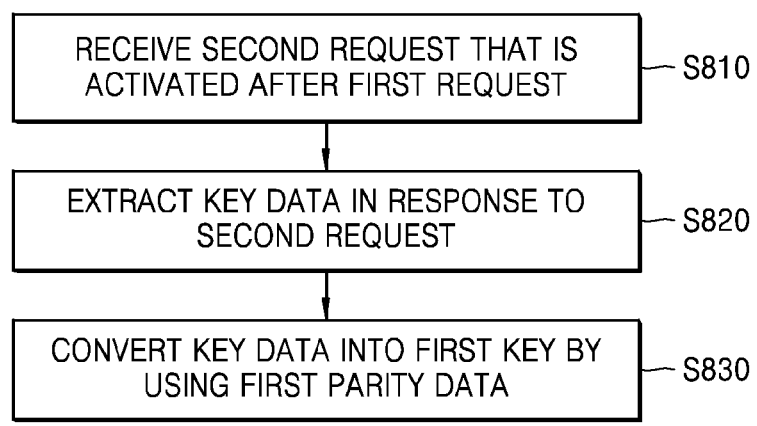
FIG. 8 is a flowchart of an operation of a memory system when a second request is received after the operations included in the method of FIG. 1 may be performed, according to an embodiment of the application.

The second parity data PDAT2 may also be generated by an ECC engine provided separately from the ECC engine that performs ECC encoding on the normal data, or may be generated by the same ECC engine as that used to generate the first parity data PDTA1 or by a separate ECC engine. However, one or more embodiments are not limited thereto, and, as will be described later, the first parity data PDTA1 or the second parity data PDTA2 may be generated using the ECC engine used to encode the normal data. An ECC engine or ECC engines may be included in the memory controller 300 or the memory device 400. FIG. 8 is a flowchart of operations for reproducing the original key after the operation of FIG. 1 of deleting the original key. Referring to FIGS. 2, 4, and 8, the memory system operating method of FIG. 1 may further include an operation S810 of receiving a second request CHL2 that is activated after the first request CHL1, an operation S820 of extracting key data in response to the second request CHL2, and an operation S830 of converting the key data into the first key by using the first parity data.

The first request CHL1 and the second request CHL2 may be transmitted from the memory controller 300 to the memory device 400. Respective responses RSP to the first request CHL1 and the second request CHL2 are results of encrypting the original key or the first key, which is obtained by reproducing the original key, and may be transmitted from the memory device 400 to the memory controller 300.

Operation S820 of extracting the key data may be performed by reading first data (for example, the security data SDTA). Alternatively, operation S820 of extracting the key data may be performed via compression or division.

Operation S830 of converting the key data into the first key by using the first parity data PDTA1 may be performed by reading the first parity data PDTA1 from the cell array 440 and ECC decoding the key data by using the first parity data PDTA1.

Figure 9:
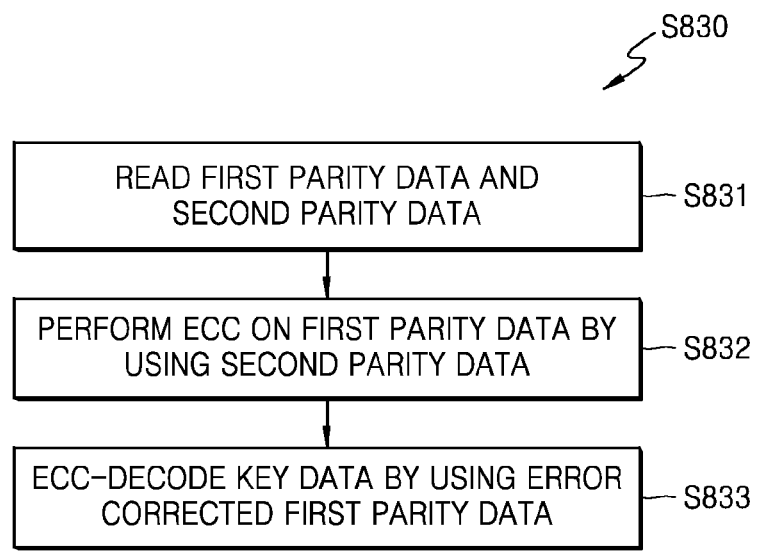
FIG. 9 is a flowchart of an operation, performed by the memory system and illustrated in FIG. 8, of converting key data into a first key.

FIG. 9 is a flowchart of an example of the operation S830 of converting the key data into the first key by using the first parity data PDTA1. Referring to FIG. 9, operation S830 of converting the key data into the first key by using the first parity data PDTA1 corresponds to a case where the second parity data PDTA2 exists as described above. First, in operation S831, the first parity data PDTA1 and the second parity data PDTA2 may be read. In operation S832, ECC may be performed on the first parity data PDTA1 by using the second parity data PDTA2. In operation S833, the key data is ECC-decoded using error corrected first parity data PDTA1 to generate the first key.

Figure 10:
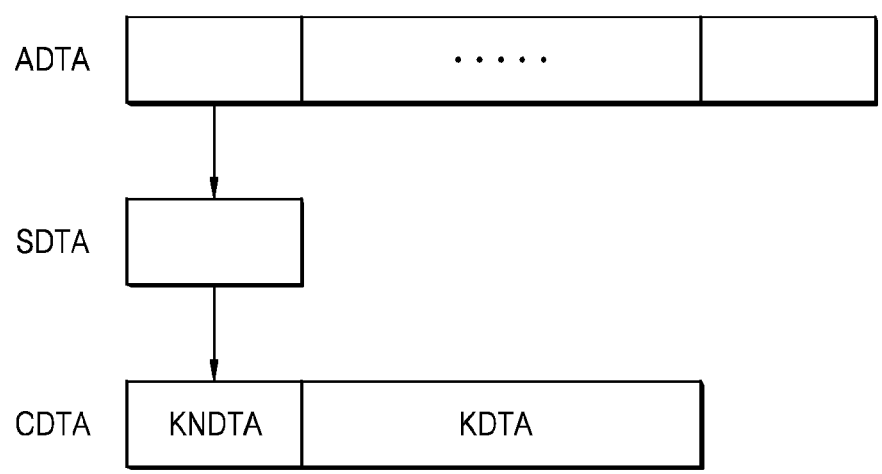
FIGS. 10-13 illustrate cases where the memory system of FIG. 2 includes an error check and correction (ECC) engine.

FIG. 10 is a block diagram for illustrating the operation S833 of FIG. 9 of converting the key data into the first key. Referring to FIG. 10, the first data, for example, the security data SDTA, may be divided by N (where N is an integer equal to or greater than 2) to extract key data KDTA. However, one or more embodiments are not limited thereto, and the key data KDTA may be extracted by compressing the first data to have a size of 1/N. The key data KDTA may also be extracted from K (where K is an integer equal to or greater than 2) pieces of first data. A size of the key data KDTA when the key data KDTA is extracted from the K pieces of first data may be equal to that when the key data KDTA is extracted from one piece of first data. In this case, N and K may be set to differ from each other according to the error correction capability of an ECC engine. For example, when the ECC engine has a high error correction capability, K may be set to be large and N may be set to be small.

The key data KDTA and known data KNDTA may be combined into combined data CDTA. A size of the combined data CDTA may be equal to that of the normal data of the memory system 200. Accordingly, the authentication operation may be performed using the ECC engine included in the memory system 200. The known data KNDTA denotes data that is known by an ECC engine. For example, all of bits included in the known data KNDTA may be 1 or 0. However, one or more embodiments are not limited thereto, and the known data KNDTA may be a combination of 1 and 0.

In response to the second request CHL2 which is activated after the first request CHL1, the key data (or combined data) may be decoded using the read first parity data PDTA1, thereby generating the first key. Then, encryption may be performed using the first key, and thus a response RSP to the second request CHL2 may be processed.

During such ECC decoding, an error correction capability of an ECC engine is restricted. For example, the ECC engine is able to correct only an error of two bits. However, since the ECC engine performing the ECC decoding is aware of known data, error correction may be performed only on a first area for sub-data, and thus the first key generated according to the above-described operation is highly likely to be consistent with the original key. An ECC engine performing ECC may support soft decision. In this case, the first area and a second area may be set to have different reliability values.

As such, in the memory device, the memory system, and the method of operating the memory system according to an embodiment of the application, a distribution of a security key is deleted and also is easily reproduced, thereby reinforcing security efficiently. Moreover, as described above, according to setting of the code rate or reliability value of the ECC engine, generation of a difference between the original key and the first key may be addressed.

The first key generated as described above may be stored in a volatile storage area (not shown) of the memory system 200. For example, the first key may be stored in a register (not shown) of the memory device 400. For example, the volatile storage area of the memory system 200 may be included in the memory controller 420 or may be included outside the memory controller 420 and the memory device 400. When a third request CHL3 generated after the second request CHL2 is received, the memory system 200 may process a response to the third request CHL3 by using the first key stored in the volatile storage area. In other words, when the third request CHL3 is received, the first key stored in the volatile storage area is read and ECC-decoded, thus operations (e.g., extraction of the key data) required to generate the first key may be omitted. Thus, overhead due to key reproduction may be reduced.

Figure 11:
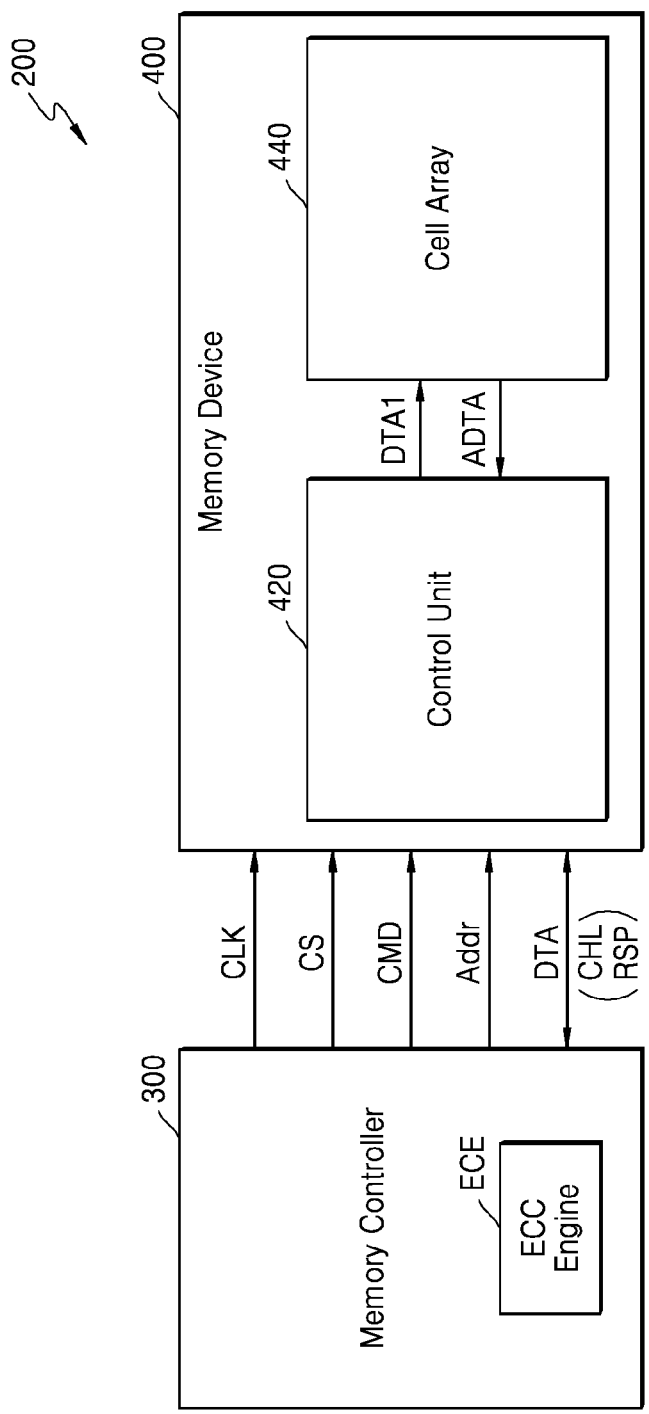
Figure 12:
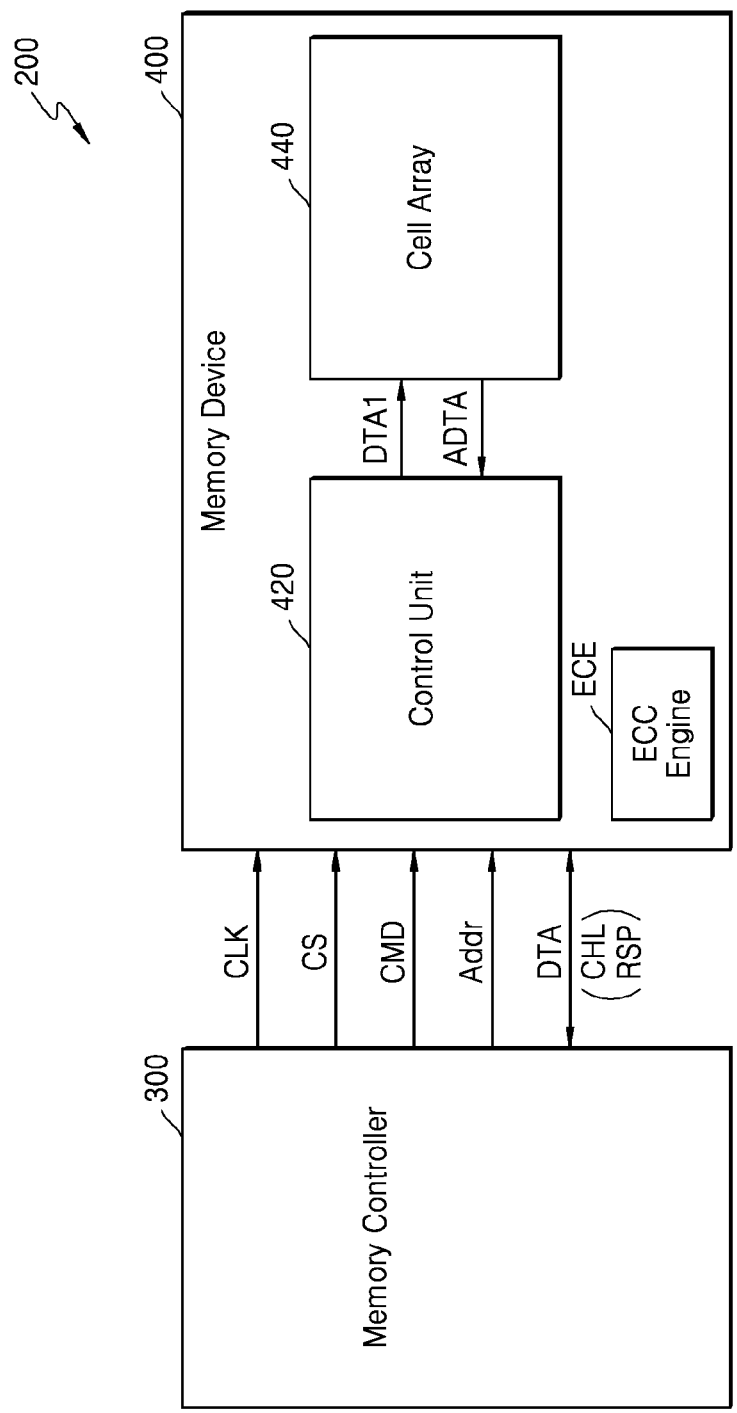
Figure 13:
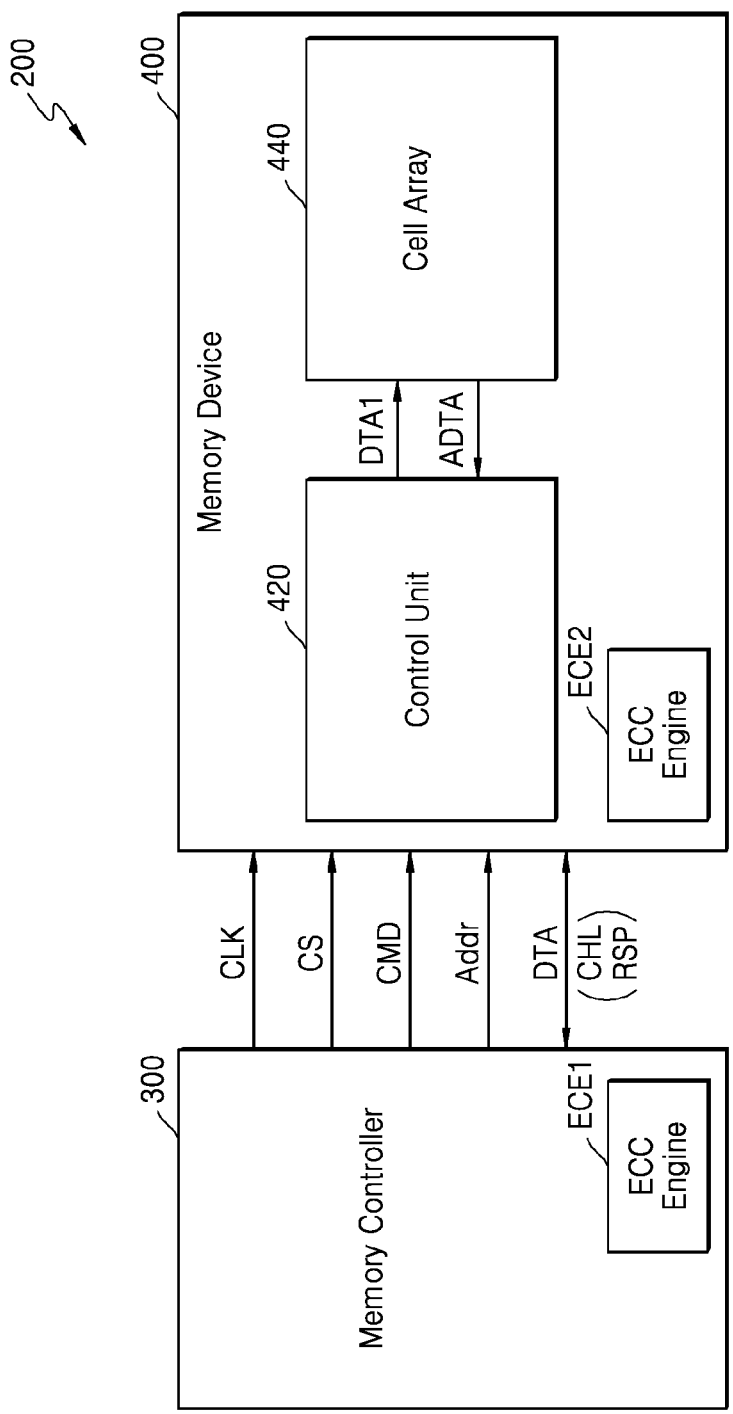

FIGS. 11-13 are block diagrams illustrating cases where the memory system 200 of FIG. 2 includes an ECC engine. Referring to FIG. 11, an ECC engine ECE performing the ECC may be included in the memory controller 300. Alternatively, referring to FIG. 12, the ECC engine ECE may be included in the memory device 400. When the ECC engine ECE is included in the memory controller 300, a layout area for the ECC engine ECE is relatively less restricted, and thus a high-performance ECC engine ECE having an increased error correction capability may be included. However, when the ECC engine ECE is included in the memory controller 300, data transmission between the memory controller 300 and the memory device 400 may be frequently performed.

Referring to FIG. 13, a first ECC engine ECE1 may be included in the memory controller 300, and a second ECC engine ECE2 may be included in the memory device 400. In this case, one of the first ECC engine ECE1 and the second ECC engine ECE2 may be used during a normal operation and the other may be used to reproduce the original key. However, one or more embodiments are not limited thereto, and both the first ECC engine ECE1 and the second ECC engine ECE2 may be used for a normal operation and for reproduction of the original key. In this case, since ECC or the like is performed by both the first ECC engine ECE1 and the second ECC engine ECE2, the reliability of the memory system 200 may increase.

Figure 14:
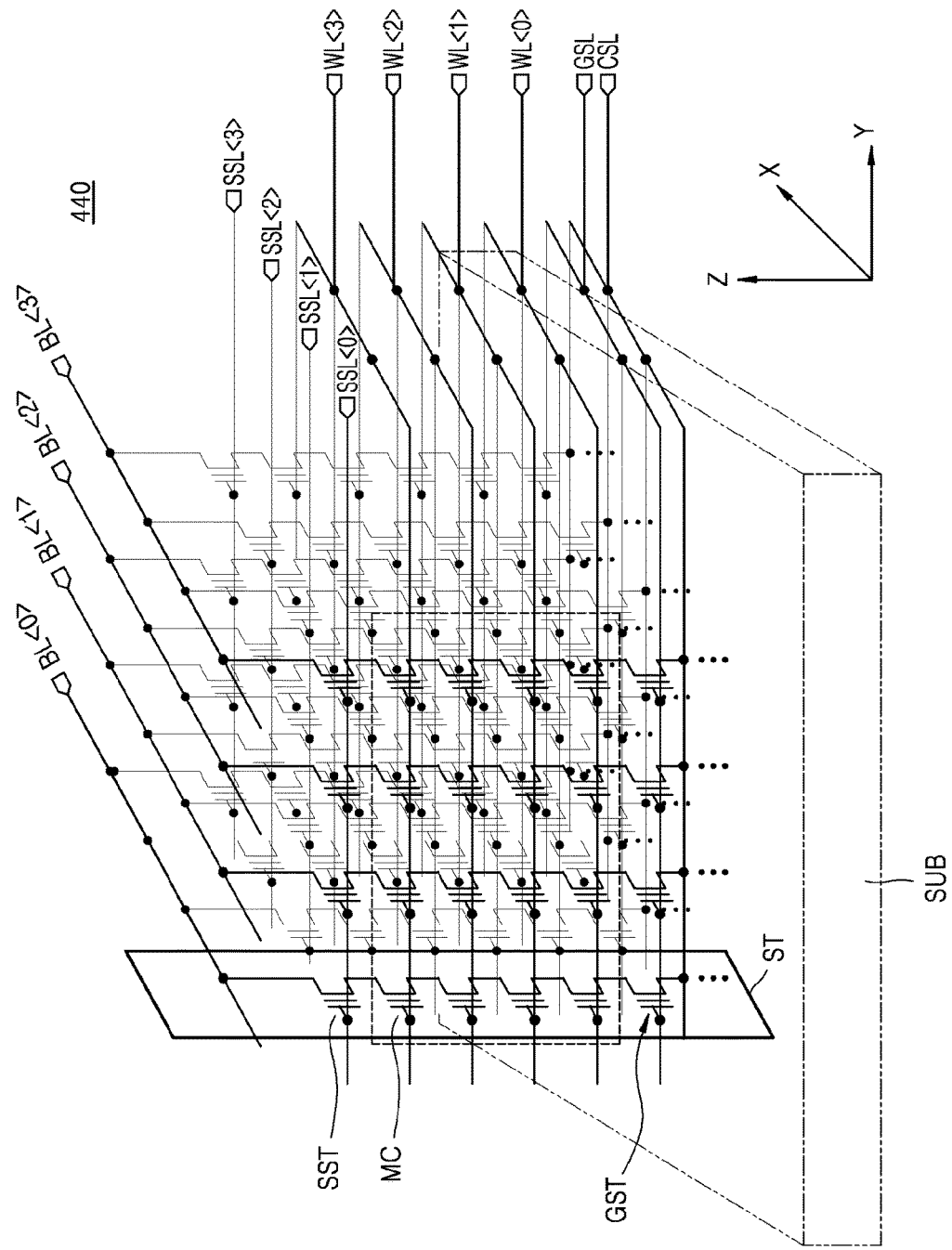
FIG. 14 illustrates an example of the memory device of FIG. 2.

FIG. 14 illustrates an example of the cell array 440 of FIG. 2. The cell array 440 of FIG. 2 may be a two-dimensional NAND flash memory. Alternatively, the cell array 440 of FIG. 2 may be embodied as a vertical NAND flash memory cell array where memory cells are three-dimensionally stacked, as shown in FIG. 14. A three-dimensional cell array 440 of FIG. 14 may include a substrate SUB, a plurality of memory cell strings ST, wordlines WL<0> through WL<3>, and bitlines BL<0> through BL<3>. Each of the memory cell strings ST may extend in a direction protruding from the substrate SUB (e.g., a vertical Z-axis direction). Each of the memory cell strings ST may include memory cells MC, a source selection transistor SST, and a ground selection transistor GST. The source selection transistors SST may be connected to source selection lines SSL<0> through SSL<3> extending in a column (Y-axis) direction and thus may be controlled, and the ground selection transistors GST may be connected to ground selection lines GSL extending in both row (X-axis) and column (Y-axis) directions and thus may be controlled.

The wordlines WL<0> through WL<3> are arrayed in the Z-axis direction perpendicular to the substrate SUB. The wordlines WL<0> through WL<3> are located respectively at layers where memory cells MC of each of the memory cell strings ST exist. Each of the wordlines WL<0> through WL<3> are combined with memory cells MC that are arrayed as a matrix in the X and Y axes directions on the substrate SUB. Each of the bitlines BL<0> through BL<3> may be connected to the memory cell strings ST that are arrayed in the row (X-axis) direction. The memory cells MC, the source selection transistor SST, and the ground selection transistor GST in each of the memory cell strings ST may share the same channel. The channel may extend in the Z-axis direction that is perpendicular to the substrate SUB.

A program operation and/or a verification operation may be controlled to be performed on the memory cells MC by applying, by the control unit 420 of FIG. 2, an appropriate voltage to the wordlines WL<0> through WL<3> and the bitlines BL<0> through BL<3>. For example, when a set voltage is applied to the source selection lines SSL<0> through SSL<3> connected to the source selection transistors SST and the bitlines BL<0> through BL<3>, a random memory cell string ST may be selected, and when a set voltage is applied to the wordlines WL<0> through WL<3>, and a random memory cell MC of the selected memory cell string ST is selected, a read operation, a program operation, and/or a verification operation may be performed on the selected memory cell MC.

Figure 15:
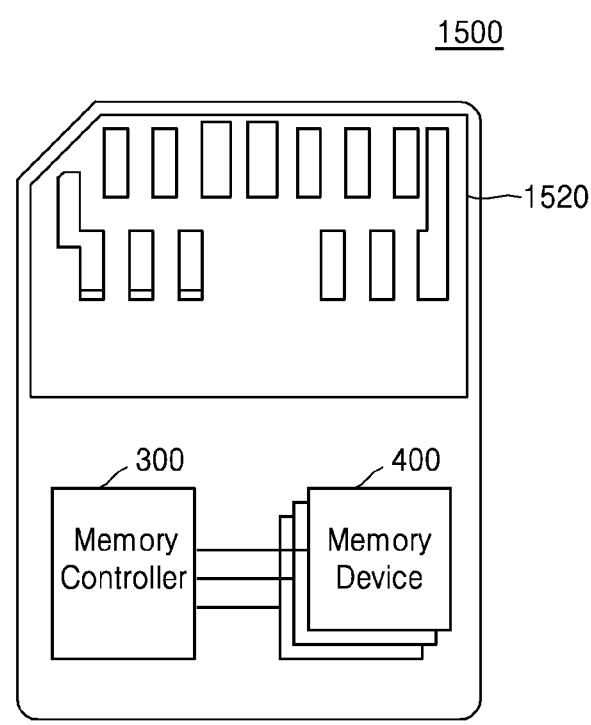
FIG. 15 is a block diagram of a memory card according to an embodiment of the application.

FIG. 15 is a block diagram of a memory card 1500 according to an embodiment of the application. The memory card 1500 may be a portable storage device that is usable by being connected to an electronic device such as a mobile device or a desktop computer. As illustrated in FIG. 15, the memory card 1500 may include a memory controller 300, a memory device 400, and a port area 1520. The memory card 1500 may communicate with an external host (not shown) via the port area 1520, and the memory controller 300 may control the memory device 400. The memory controller 300 may read a program from a ROM (not shown) to control the memory device 400. The memory controller 300 and the memory device 400 of FIG. 15 may correspond to the memory controller 300 and the memory device 400 of FIG. 2, respectively.

Figure 16:
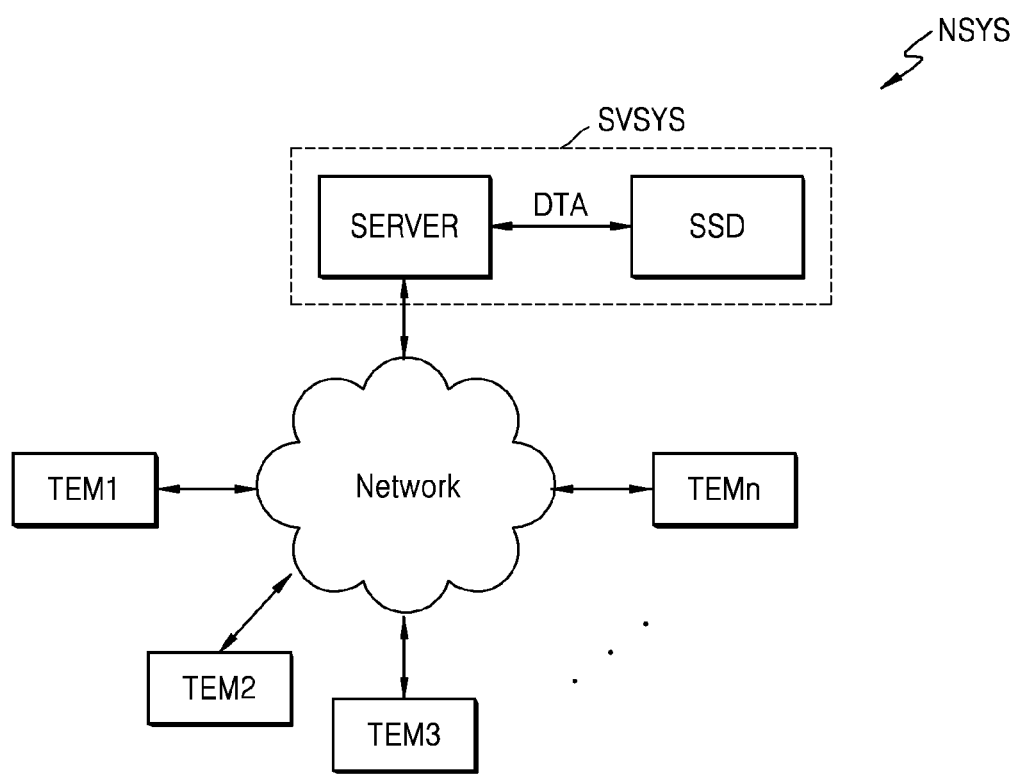
FIG. 16 illustrates a network system including a server system including the SSD of FIG. 3, according to an embodiment of the application.

FIG. 16 illustrates a network system NSYS including a server system SVSYS including the SSD of FIG. 3, according to an embodiment. Referring to FIG. 16, the network system NSYS may include the server system SVSYS and a plurality of terminals TEM1 through TEMn which are connected via a network. The server system SVSYS may include a server which processes requests received from the terminals TEM1 through TEMn connected via the network, and the SSD which stores data corresponding to the requests received from the terminals TEM1 through TEMn. Thus, the network system NSYS and the server system SVSYS according to the present embodiment may reliably perform authentication between a controller and a memory of the SSD, and thus may achieve reliability of the network system NSYS.

While the application has been particularly shown and described with reference to exemplary embodiments thereof, it will be understood that various changes in form and details may be made therein without departing from the spirit and scope of the following claims.

What is claimed is:

1. A method of operating a memory system including a non-volatile memory device, the method comprising:
   processing a response to a first request toward the non-volatile memory device using an original key;
   generating and storing first parity data corresponding to the original key;
   eliminating, after generating the first parity data, the original key from existence, while keeping the first parity data;
   receiving a second request that is activated after the first request;
   extracting key data from security data, stored solely in the non-volatile memory device, in response to the second request;
   converting the key data into a first key using the first parity data; and
   processing a response to the second request using the first key, wherein
   the original key is related to a physical feature of the non-volatile memory device.

2. The method of claim 1, wherein the generating and storing of the first parity data comprises:
   generating the first parity data by performing Error Check and Correction (ECC) encoding on the original key; and
   storing the first parity data in a non-volatile cell array of the non-volatile memory device.

3. The method of claim 2, further comprising generating second parity data by ECC encoding the first parity data and storing the second parity data.

4. The method of claim 1, wherein the security data is a threshold voltage distribution characteristic of the non-volatile memory device.

5. The method of claim 1, wherein the converting of the key data into the first key comprises:
   reading the first parity data from a non-volatile cell array of the non-volatile memory device; and
   error check and correction (ECC) decoding the key data using the first parity data.

6. The method of claim 1, wherein:
   the extracting key data comprises extracting the key data by dividing the security data by N, wherein N is an integer equal to or greater than 2, and
   the converting of the key data into the first key comprises:
      generating combined data by combining the key data and known data;
      reading the first parity data from a non-volatile cell array of the non-volatile memory device; and
      Error Check and Correction (ECC) decoding the combined data using the first parity data.

7. The method of claim 6, wherein the ECC decoding of the combined data comprises differently setting a reliability value of the first parity data and a reliability value of the known data.

8. The method of claim 5, wherein the extracting of the key data comprises:
   extracting the key data from K pieces of the security data, wherein K is an integer equal to or greater than 2, and
   setting values of K and N based on an error correction capability of an Error Check and Correction (ECC) engine that performs the ECC decoding.

9. The method of claim 1, further comprising storing the first key in a volatile storage area of the memory system.

10. The method of claim 9, further comprising:
    receiving a third request that is activated after the second request; and
    generating a response to the third request using the first key stored in the volatile storage area, in response to the third request.

11. The method of claim 1, further comprising:
    generating second parity data by Error Check and Correction (ECC) encoding the first parity data and storing the second parity data, wherein:
    the converting of the key data into the first key comprises:
       reading the first parity data and the second parity data;
       performing ECC on the first parity data using the second parity data; and
       ECC decoding the key data using the first parity data and the second parity data.

12. The method of claim 1, wherein the non-volatile memory device is a NAND flash memory device.

13. A method of operating a memory system including a non-volatile memory device, the method comprising:
    processing a response to a first request toward the non-volatile memory device using an original key, in response to the first request;
    generating and storing first parity data corresponding to the original key;
    eliminating, after generating the first parity data, the original key from existence, while keeping the first parity data; and
    reproducing the original key using the first parity data, in response to a second request that is activated after the first request, wherein
    the original key is related to a physical feature of the non-volatile memory device.

14. The method of claim 13, wherein the reproducing of the original key comprises:
    extracting key data from security data that indicates a physical characteristic of the non-volatile memory device;
    padding known data into the key data;
    reading the first parity data and Error Check and Correction (ECC) decoding the padded known data using an ECC engine that is used when the non-volatile memory device writes or reads normal data; and processing a response to the second request using a result of the ECC decoding.

15. The method of claim 4, wherein the key data indicates a physical characteristic of the non-volatile memory device.

16. The method of claim 15, wherein the physical characteristic is a threshold voltage distribution of programmed memory cells of the non-volatile memory device.

17. The method of claim 14, wherein the physical characteristic is a threshold voltage distribution of programmed memory cells of the non-volatile memory device.

18. A memory system comprising:
a nonvolatile memory; and
a memory controller that:
retrieves an original key from the nonvolatile memory upon receiving an initial request for access to the nonvolatile memory;
error-correction encodes the retrieved original key to generate first parity data and stores the generated first parity data in the nonvolatile memory;
retrieves, upon receiving a request for access to the nonvolatile memory, the first parity data and second parity data from the nonvolatile memory and performs error correction on the retrieved first parity data using the second parity data;
retrieves key data by extracting the key data from security data stored in the nonvolatile memory and reproduces an original key by error-correction decoding the key data using the error-corrected first parity data; and
processes a response to the request for access to the nonvolatile memory using the reproduced original key, wherein
the original key is related to a physical feature of the nonvolatile memory.

19. The memory system of claim 18, wherein the key data comprises a threshold voltage distribution of one or more programmed memory cells of the nonvolatile memory.

20. The memory system of claim 18, wherein the memory controller stores the reproduced original key in volatile memory and processes a subsequently-received request for access to the nonvolatile memory using the reproduced original key stored in the volatile memory.

21. The memory system of claim 18, wherein the memory controller:
erases the original key from the nonvolatile memory; and
error-correction encodes the first parity data to generate the second parity data and stores the generated second parity data in the nonvolatile memory.

22. The memory system of claim 21, wherein the memory controller processes a response to the initial request for access to the nonvolatile memory using the original key retrieved from the nonvolatile memory and, thereafter, erases the original key from the nonvolatile memory.

23. A method executed by a memory controller of providing access to a nonvolatile memory, the method comprising:
retrieving an original key from the nonvolatile memory upon receiving an initial request for access to the nonvolatile memory;
error-correction encoding the retrieved original key to generate first parity data;
retrieving, upon receiving a request for access to the nonvolatile memory, the first parity data, second parity data, and key data stored in the nonvolatile memory by extracting the key data from security data;
performing error correction on the retrieved first parity data using the second parity data;
reproducing an original key by error-correction decoding the key data using the error-corrected first parity data; and
processing a response to the request for access to the nonvolatile memory using the reproduced original key, wherein
the original key is related to a physical feature of the nonvolatile memory.

24. The method of claim 23, wherein the key data comprises a threshold voltage distribution of one or more programmed memory cells of the nonvolatile memory.

25. The method of claim 23, further comprising:
storing the reproduced original key in volatile memory; and
processing a subsequently-received request for access to the nonvolatile memory using the reproduced original key stored in the volatile memory.

26. The method of claim 23, further comprising:
storing the generated first parity data in the nonvolatile memory;
erasing the original key from the nonvolatile memory;
error-correction encoding the first parity data to generate the second parity data; and
storing the generated second parity data in the nonvolatile memory.

27. The method of claim 26, further comprising:
processing a response to the initial request for access to the nonvolatile memory using the original key retrieved from the nonvolatile memory; and
thereafter, erasing the original key from the nonvolatile memory.

* * * * *